(12) United States Patent
Symko et al.

(10) Patent No.: US 6,712,915 B2
(45) Date of Patent: *Mar. 30, 2004

(54) FORMATION AND APPLICATIONS OF ALCUFE QUASICRYSTALLINE THIN FILMS

(75) Inventors: Orest G. Symko, Salt Lake City, UT (US); Ehab Abdel-Rahman, Sluut (EG); Wanjun Park, Chungsti (KR); Thierry Klein, Saint Martin (FR); David Kieda, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/957,893

(22) Filed: Sep. 21, 2001

(65) Prior Publication Data

US 2002/0079025 A1 Jun. 27, 2002

Related U.S. Application Data

(63) Continuation-in-part of application No. 08/357,435, filed on Dec. 15, 1994, now Pat. No. 6,294,030.

(51) Int. Cl.$^7$ .............................................. C22C 21/00
(52) U.S. Cl. ...................... 148/415; 148/416; 148/438; 148/439; 420/538; 427/405; 428/650
(58) Field of Search ................. 148/415, 416, 148/438, 439; 420/538; 427/405; 428/650

(56) References Cited

U.S. PATENT DOCUMENTS

| | | |
|---|---|---|
| 4,595,429 A | 6/1986 | Le Caer et al. |
| 4,710,246 A | 12/1987 | Le Caer et al. |
| 5,204,191 A | 4/1993 | Dubois et al. |
| 6,294,030 B1 | 9/2001 | Symko et al. |

OTHER PUBLICATIONS

Brodie et al., The Physics of Microfabrication, pp. vii–x and 1–4, Apr. 1981, Plenum Press.

Fauchais et al., Plasma spraying: present and future, Pure & Appl. Chem., 1994., pp. 1247–1258, vol. 66, No. 6, Great Britain.

Muenz et al., Cathode sputtering coats working tools and fine jewelry, Industrial Research & Development, Sep. 1981, pp. 130–135,.

Westwood, Sputter Deposition Processes, MRS Bulletin, Dec. 1988, pp. 46–51.

Brodie et al., The Physics of Microfabrication, pp. vii–x and 1–4, Apr. 1982, Plenum Press, USA.

B. Chapman, Glow Discharge Processing, Ch.9, Introduction to Sputtering, pp. 291–316, 1980, John Wiley & Sons, USA.

Colclaser et al., Microelectronics: Processing and Device Design, pp. 1–2, 1980, John Wiley & Sons, USA.

L. Eckertova, Physics of Thin Films, pp. 11–17, 1986, Plenum Press, USA.

Fauchais et al., Plasma spraying: present and future, Pure & Appl. Chem., 1994., pp. 1247–1258, vol. 66, No. 6, Great Britain.

Matejka et al., Plasma Spraying of Metallic and Ceramic Materials, pp. 31–273, 1989, John Wiley & Sons, USA.

Muenz et al., Cathode sputtering coats working tools and fine jewelry, Industrial Research & Development, Sep. 1981, pp. 130–135,.

Westwood, Sputter Deposition Processes, MRS Bulletin, Dec. 1988, pp. 46–51, USA.

Brodie et al., The Physic of Microfabrication, Chapter 3, Thin Films, pp. 227–229, Apr. 1982, Plenum Press, USA.

*Primary Examiner*—Sikyin Ip
(74) *Attorney, Agent, or Firm*—TraskBritt

(57) ABSTRACT

Various articles of manufacture, such as electrosurgical scalpels, razor blades, electronic components and mechanical components having a quasicrystalline AlCuFe alloy film less than about 10,000 Å thick. Such articles of manufacture may be formed by depositing (in sequence) on a substrate through radio frequency sputtering a stoichiometric amount of each respective alloy material and then annealing those layers to form the film through solid state diffusion.

21 Claims, 4 Drawing Sheets

FORMATION AND APPLICATIONS OF ALCUFE QUASICRYSTALLINE THIN FILMS

CROSS-REFERENCE TO RELATED APPLICATION

This application is a continuation-in-part of application Ser. No. 08/357,435, filed Dec. 15, 1994, now U.S. Pat. No. 6,294,030, Sep. 25, 2001, the contents of the entirety of which is incorporated herein by this reference.

TECHNICAL FIELD

This invention relates to thin metal alloy films which are quasicrystalline and/or approximately quasicrystalline, as opposed to amorphous or crystalline, in nature. It is particularly directed to a method for making very thin films from materials having the general formula $Al_aCu_bFe_cX_dI_e$, where X represents one or more optional alloy elements, I represents manufacturing impurities and a–e are more thoroughly defined herein. It is further directed to applications which take advantage of the unique properties of such films.

BACKGROUND

Alloy metal films are well known in the art. Alloys having the general formula $Al_aCu_bFe_cX_dI_e$, where X represents one or more elements selected from the group consisting of V, Mo, Ti, Zr, Nb, Cr, Mn, Ru, Rh, Ni, Mg, W, Si and the rare earth elements, and I represents manufacturing impurities, generally present in an amount of less than two percent of the atoms present, are disclosed, for example, by U.S. Pat. No. 5,204,191. U.S. Pat. Nos. 4,595,429 and 4,710,246 disclose a number of aluminum-based alloys characterized by amorphous or microcrystalline structures.

An icosahedral phase was observed in 1984 in a rapidly quenched AlMn alloy. Since that time, many experiments have been carried out to clarify the structure and properties of this new ("quasicrystalline") state of condensed matter. The AlMn alloy is metastabile and many other quasicrystalline phases are also metastable; however, there are ternary (and more complicated) quasicrystalline alloys which have evidenced thermodynamic stability. The AlCuFe alloys, for example, provide stable pure icosahedral phases of high structural quality and peculiar electronic, mechanical and magnetic properties. Notably, such alloys are characterized by unusually high electrical resistivity values, which increase as the structural quality of the sample is improved; a very low thermal conductivity; a low density of states at the Fermi level; a strong composition dependence of the resistivity and the Hall coefficient and a diamagnetic susceptibility; a low surface energy with small coefficient of friction and almost non-stick properties.

The AlCuFe alloys have typically been prepared either by melt spinning or long term annealing of bulk ingots. Monograins of millimeter size have been produced by these techniques. Coatings that are several microns in thickness have been obtained by plasma spraying three elements onto liquid nitrogen cooled substrates and then annealing the resulting deposits. Binary metastable quasicrystals have also been produced by solid state diffusion of either sputtered or evaporated layers. Decagonal $Al_3Pd$ phases have been obtained by the lateral diffusion of Al islands on a Pd thin film.

SUMMARY OF THE INVENTION

This invention provides an article of manufacture including a quasicrystalline metal alloy film less than about 10,000 Å thick. While 10,000 Å is not regarded as a "critical" boundary, it represents the approximate upper limit of film thickness at which the films of this invention are currently believed to be distinguishable from films of similar composition produced by other means. The film has a composition of the general formula $Al_aCu_bFe_cX_dI_e$, wherein X represents one or more optional alloy elements and I represents manufacturing impurities. In typical films, a=100–b–c–d–e; 24<b<26; 12<c<13; 0<d<10; and 0<e<3. More preferred film compositions are approximately: a=100–b–c–d–e; 24.4<b<26.0; 12.0<c<13.0; d=0; e=trivial. The film is formed by depositing, in sequence on a substrate, by radio frequency sputtering, a stoichiometric amount of each respective constituent material and then annealing the layers, and hereby forming the film through solid state diffusion. The substrate may comprise an electrical insulator or a conductor, such as an alloy, and the film may be utilized as a component of an electronic device or as the casting of a mechanical device. The substrate may, alternatively, comprise a wear surface or cutting edge, and the film may be utilized as a protective coating and/or for thermal isolation and/or enhanced performance.

According to the invention, very thin films, typically less than about 10,000 Å, ideally from about 100 Å to 10,000 Å thick, are produced by a technique involving depositing "stoichiometric" ratios of selected alloy elements in sequence on an oscillating substrate, and then annealing the deposited layers to produce an alloy having a composition within a quasicrystalline phase. The term "stoichiometric" is used in this disclosure to indicate the presence of atoms of selected elements in a predetermined numerical ratio. Accordingly, layers of the selected alloy elements are deposited in sequence in precise amounts on a suitable substrate. This process essentially allows an atom by atom deposition with control on the amount of each element. Within practical limits, annealing of those layers will produce an alloy composition reflecting the stoichiometric ratio of the layers. This approach has been found effective to produce very thin films possessing excellent properties for a variety of practical applications. The films of this invention are ideally comprised of ternary stable AlCuFe quasicrystals prepared by the solid state diffusion of Al, Cu and Fe layers, an exemplary such film being formed from layers of Al, Cu and Fe deposited in sequence in thickness ratios of approximately 7.0/1.0/2.0, respectively, prior to annealing.

While this disclosure emphasizes AlCuFe alloys, the film formation techniques of this invention are regarded as being generally applicable to any alloy composition within a quasicrystalline region of a phase diagram descriptive of any alloy system of interest. The aluminum-rich alloys described by U.S. Pat. Nos. 4,595,429, 4,710,246 and 5,204,191 are of primary interest because of the interesting properties observed to be characteristic in these alloys.

Practical applications for films produced by this invention include electronic circuits for devices; coatings to reduce friction and wear in machines including monostructures, bearings, cutting tools and circuits; protection of hard disk surfaces against hard crashes and providing low friction surfaces to devices such as magnetic storage drives and magnetic tape or disc heads. The high hardness and low friction characteristics of quasicrystalline materials are well suited for coatings of cutting surfaces, such as razor blades, surgical blades, and knives, generally offering smoother performance with less tear of flesh or other forms of degradation typically encountered in cutting various materials. Such coatings impart non-stick characteristics to the blades in use, and extend their useful lives. Electrosurgical blades coated with a thin film of quasicrystalline AlCuFe material offer superior mechanical and electrical performance, for example, compared to presently-used TEFLON-coated blades or non-coated blades. Similar coatings may also be applied to the critical surfaces of sports equipment, notably skates and skis.

The low thermal conductivity of the films of this invention enables them to function well in a variety of applications. For example, a quasicrystalline coating may function as a heat shield or to maintain a thermal gradient.

Various substrates are practical. Strontium titanate, silicon, silicon dioxide, sapphire and steel are exemplary substrates. Very thin films can be fabricated in accordance with this invention, and both the thickness and purity level of the film can be well controlled. The process may be conducted so that film formation takes place by solid state diffusion, without going through a liquid phase. Lower anneal temperatures (600° C. for a particular alloy compared to the 800° C. temperature required for the same alloy in bulk ingot form) are effective. A two-step heat treatment is presently preferred. In the specific case of AlCuFe, the first step is conducted at a relatively lower temperature to form the first-to-form aluminum-rich alloy; i.e. $Al_3Fe$. The second step is conducted at a relatively higher temperature to promote formation of the quasicrystalline phase. Films of certain alloys consist of grains smaller then 0.5 μm in diameter.

A notable benefit of the formation technique of this invention; i.e., the combination of sputtering and solid state diffusion, is the resulting excellent adherence of the quasicrystalline film to the substrate.

According to the invention, various articles of manufacture, such as electrosurgical scalpels, razor blades, and electronic components, comprise a quasicrystalline AlCuFe alloy film formed by depositing in sequence on a substrate through radio frequency sputtering a stoichiometric amount of each respective alloy material, and then annealing those layers to form the film through solid state diffusion. The film is ideally comprised of ternary stable AlCuFe quasicrystals prepared by the solid state diffusion of Al, Cu, and Fe layers. Layers of Al, Fe and Cu are most preferably deposited in sequence in thickness ratios of 7.0/1.0/2.0, respectively, prior to annealing. Certain articles produced by this invention utilize the film for its thermal isolation properties. Other articles utilize the film to maintain a temperature gradient. In other articles, the substrate may be associated with the cutting edge of a knife, scalpel, razor blade or electrosurgical blade. In still other articles, the substrate is an electrical insulator or conductor, and the film is utilized as a component of an electronic device. Other articles utilize the film as a coating for wear surfaces. In most instances, the film will be less than about 10,000 Å thick, typically, less than about 1000 Å thick.

DETAILED DESCRIPTION OF THE INVENTION

The disclosures of U.S. Pat. Nos. 4,595,429, 4,710,246 and 5,204,191 are each incorporated by reference as a part of this disclosure for their descriptions of alloy systems and compositions. The alloys defined by the incorporated patent disclosures are regarded as generally good candidates for the production of thin films in accordance with the techniques of this invention. The article "Formation of AlCuFe quasicrystalline thin films by solid state diffusion," T. Klein and O. G. Symko, *Appl. Phys. Lett.* 64 (4), p 431, (Jan. 24, 1994), describes work upon which this application is based in part, and is incorporated in this disclosure by reference.

Very thin films (<10,000 Å) of ternary stable AlCuFe quasicrystals were prepared by the solid state diffusion of Al, Cu, and Fe layers. It can be determined from the Al-rich part of the AlCuFe phase diagram, FIG. 1, that pure icosahedral alloys must have compositions within a narrow range, typically $Al_{100-X-Y}Cu_XFe_Y$, with 24.4<x<26.0 and 12.0<y<13.0. The icosahedral phase is surrounded by many binary and ternary crystalline phases, especially the β-AlFe (Cu) cubic phase, which is usually present as a contaminating phase in an as-quenched alloy from the icosahedral phase.

The invention is further explained by use of the following illustrative examples.

EXAMPLE I

Figure 1:
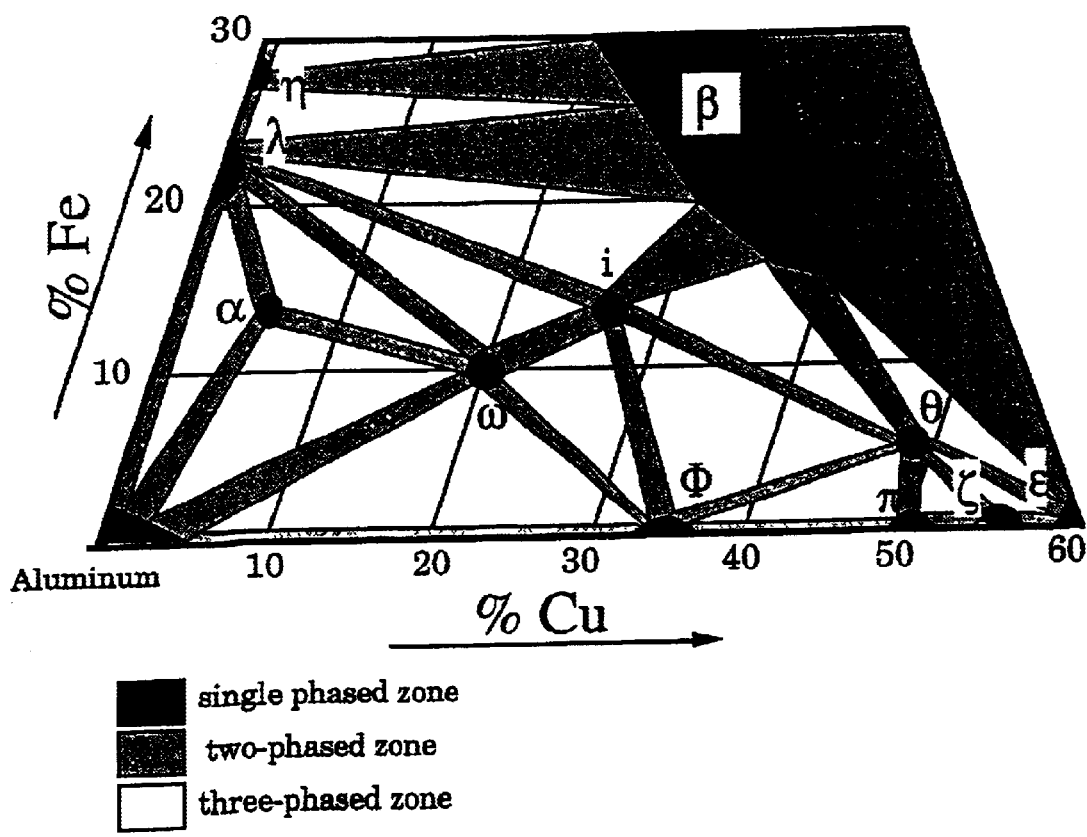
FIG. 1 reproduces the Al-rich region of the AlCuFe phase diagram.

Al, Fe, and Cu layers were sputtered consecutively at room temperature on $SrTiO_3$ substrates, using an rf magnetron sputtering system with a base pressure of about $1\times10^{-7}$ Torr. High purity argon (2–3 mTorr) was used as a sputtering gas. The radio frequency power supply was of 200 Watts capacity. The distance between the targets of each element and the sample holder was about 2 in., leading to sputtering rates of about 10, 15, and 5 Å/s for Al, Cu, and Fe, respectively. To ensure a good thickness homogeneity, the sample holder was oscillated at 0.5 Hz below the target. These oscillations were considered to be important for control of sample composition because, as shown by FIG. 1, the quasicrystalline phase can only be obtained within a very narrow composition range. The $SrTiO_3$ substrates were stuck to the sample holder with a small amount of grease. The thickness of the different layers was controlled through use of a vibrating quartz thickness monitor calibrated with pure elements. The films were then subsequently annealed in a quartz tube under high vacuum ($10^{-6}$ Torr), first at 350° C. overnight and then at 600° C. for 2 hours.

It was known that the electrical resistivity of the alloys depends upon the nominal composition and the structural quality of the sample being maximal for $Al_{62.5}Cu_{25}Fe_{12.5}$. This peculiar composition corresponds to a 7.0/2.0/1.0 thickness ratio for the Al, Cu and Fe layers, respectively. Accordingly, a 2100-Å-thick Al layer, followed by a 300 Å Fe layer and a 600 Å Cu layer were sputtered on the substrate. To compensate for small calibration errors of the thickness monitor, several samples were prepared, with the measured thicknesses of the Cu and Fe layers varying by 10 Å.

As a first characterization, electrical resistivity measurements were made of the films using a four-probe Van der Pauw technique. The structural quality of the films of highest resistivity was then checked using a low angle x-ray diffraction technique. Scanning electron microscope images were also performed to check the quality of the films.

After the first annealing treatment (350° C. overnight), the copper color of the top layer completely disappeared, indicating that the different elements had mixed together. However, the resistivity values of these films were only a few tens of μΩcm, suggesting that they were significantly contaminated by crystalline phases. A further annealing at 600° C. provided several samples with resistivity values ranging from 2000 to 3000 $\mu\Omega$cm for 600 Å<Cu layer<640 Å and 280 Å<Fe layer<300 Å on the Al layer. Outside this range, the resistivity rapidly dropped by an order of magnitude, emphasizing the strong dependence of the electrical properties on the purity of the sample. Significantly, the resistivity of the films also decreased when annealed at above 700° C., whereas in bulk samples, an annealing temperature of at least 800° C. was necessary to produce pure quasicrystalline phase of high structural quality.

Figure 2:
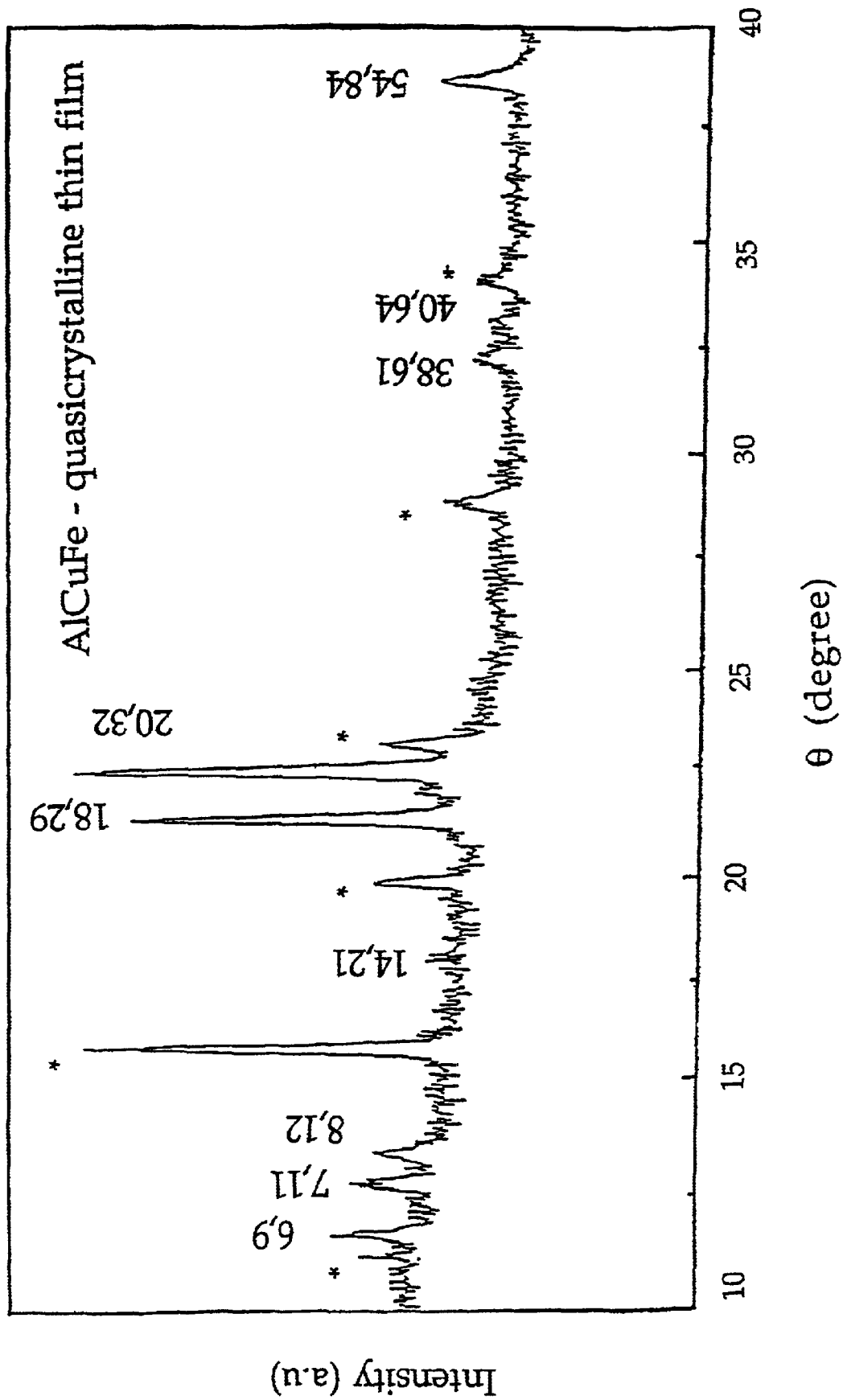
FIG. 2 is a low angle x-ray diffraction pattern of an AlCuFe thin film of the invention.
Figure 3:
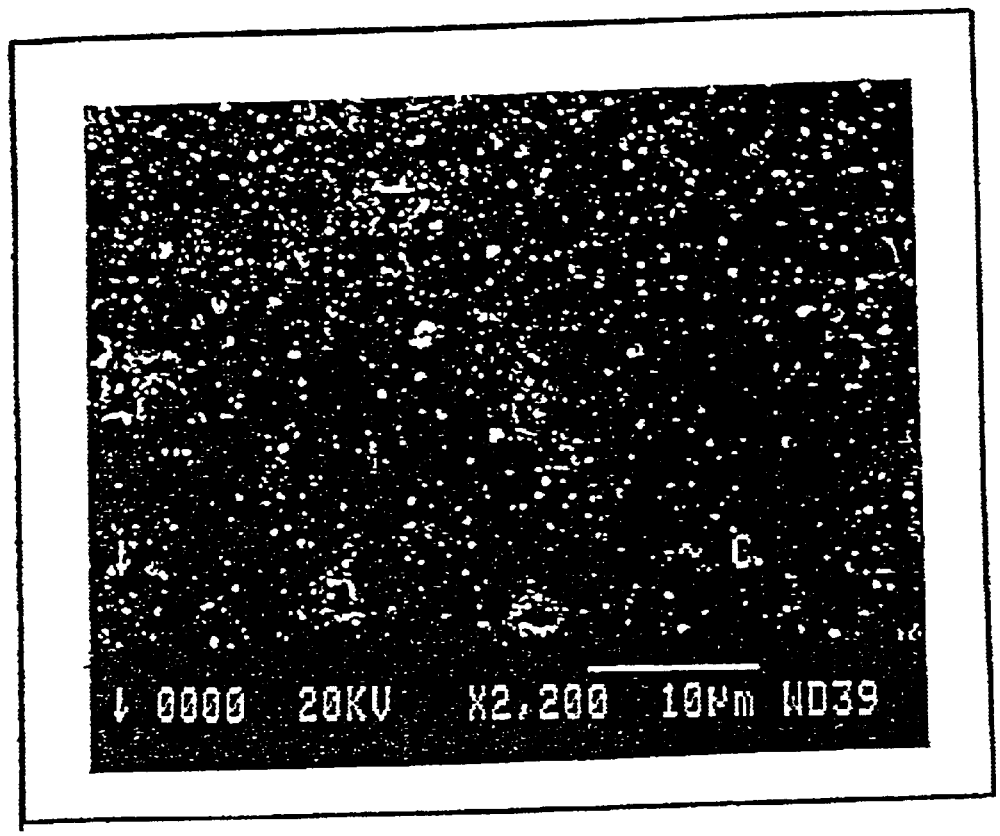
FIG. 3 illustrates a scanning electron micrograph of the AlCuFe thin film of FIG. 2, showing the polycrystalline structure of the film.

FIG. 2 presents the x-ray diffraction pattern of one of the quasicrystalline films prepared for Example 1. Except for a very small peak present in this case between the two main icosahedral peaks, all the peaks are attributable to either the icosahedral phase or the $SrTiO_3$ substrate. From this x-ray diffraction pattern, the direct lattice parameter of the film was estimated to be about 6.31 Å, in good agreement with results previously found in bulk ingot material of the same composition. The scanning electron microscope picture of this film presented in FIG. 3 shows that the poly-crystalline structure of the film consists of small quasicrystalline grains about 1 $\mu$m or less in diameter. The film is also shown to be approximately homogeneous.

EXAMPLE II

Electrosurgical blades were coated with a thin film of quasicrystalline AlCuFe by radio frequency sputtering and annealing as described by Example I. A 3000 Å thick film of $Al_{62.5}Cu_{25}Fe_{12.5}$ alloy was formed separately on each side of the blades. Excellent adherence to the blade substrate was noted.

The thus-coated blades were compared to conventional electrosurgical blades coated with TEFLON operated at the same electrical conditions (a power level of 40 watts). After about two cuts, the TEFLON blades developed a high resistance to cutting, creating visible chars on and sticking of the flesh. Damage to the TEFLON coating also became evident. By contrast, after six cuts, there were no visible signs of deterioration to the blades of this invention, and cut flesh did not stick to the blades.

X-ray diffraction patterns and transport measurements performed on films of the same composition fabricated the same way confirmed the quasicrystalline structure of these films. The films on the blades were estimated to be at least 90% quasicrystalline. The mechanical characteristics (strength and low friction) of the films on the blades are consistent with the observed behavior of quasicrystalline materials.

EXAMPLE III

Figure 4:
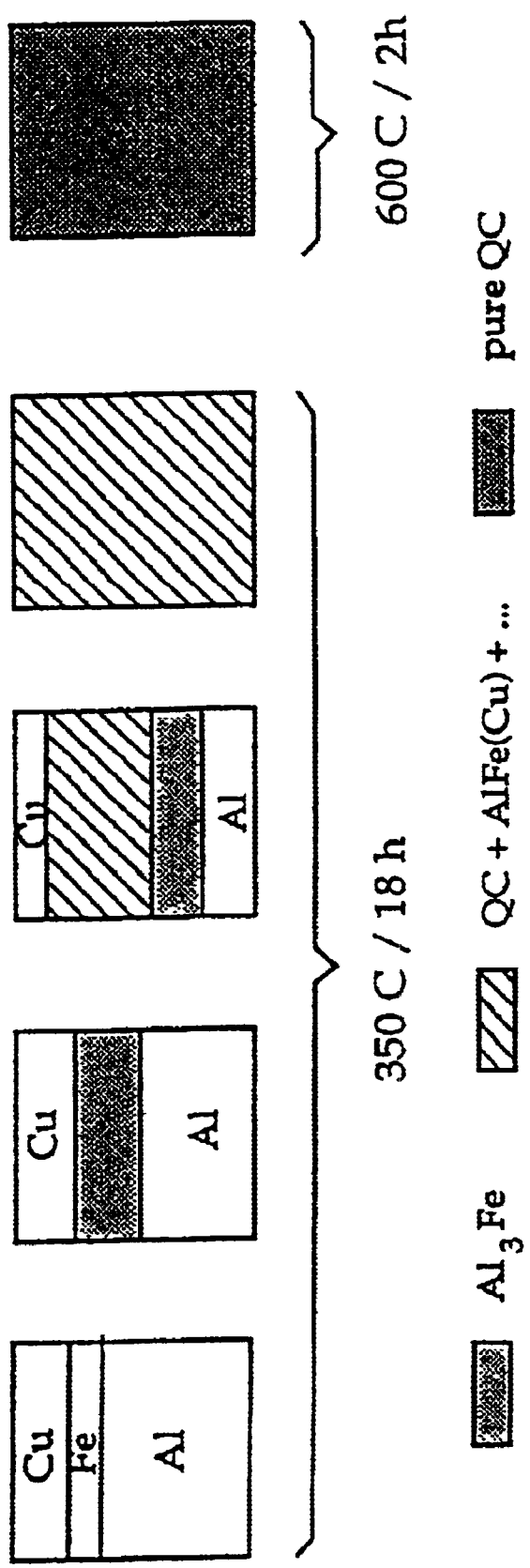
FIG. 4 is a schematic representation of a typical sequence of steps useful for the formation of a pure quasicrystalline thin film in accordance with the invention.

FIG. 4 illustrates the sequence of steps involved in a preferred method of formation of the quasicrystalline film. Significantly, it is feasible to obtain pure icosahedral films by annealing only three discrete elemental layers. Previous formation methods have relied upon alternating very thin layers of the elements of even two-element systems to obtain pure icosahedral films. The sequence in which the different layers are sputtered was found to be important in the AlCuFe system. Attempts to obtain pure quasicrystalline film using an Al—Cu—Fe sequence were not successful. This result is understood to suggest an important role played by the $Al_3Fe$ intermediate compound, which is avoided by sputtering the elements in an inappropriate sequence; e.g., Al—Cu—Fe.

EXAMPLE IV

Films of up to 10,000 Å were deposited on the side surfaces of razor blades following the procedure of Example I. Grains in the film were less than 0.5 $\mu$m in diameter. The coated blades were found to offer a low friction surface against skin. Compared to conventional Teflon-coated razor blades, the blades of this example had better durability, were less bulky and lighter in weight and were more resistant to oxidation.

EXAMPLE V

An additional modified process found that the deposition of quasicrystalline phase thin films created an even superior product. This process essentially allows an atom by atom deposition with control on the amount of each element. Thus it is possible to deposit from almost monolayers to a thickness of microns. This allows for the formation of the quasicrystalline state during deposition before the last treatment. This application provides a smooth surface on a substrate and may be applied to numerous surfaces, e.g., steel, silicon, plastics, glass, etc. Specifically, the process includes the use of three targets in a radio frequency magnetron sputtering system which simultaneously sputters a film onto a substrate using Argon gas at a pressure of approximately $2\times10^{-3}$ mm Hg. The targets are 2" in diameter and they include individual plates of Al, Cu, and Fe. The vacuum in the deposition chamber is set at approximately less than $10^{-7}$ mm Hg before the argon gas is injected for sputtering. The radio frequency power to each target is adjusted to provide stoichiometric concentrations of each element so as to form the icosahedral phase of AlCuFe. Each one of the targets provides a specific amount of the predetermined elements according to prior calibrations of the amount of element deposited at specific target power. In a preferred example, an Al target is set to an rf power of 210 watts, an Fe target to 45 watts and a Cu target to 32 watts. Note that the power is on for all three targets simultaneously. Such power levels give the desired deposition rates which are monitored for each target. Small adjustments to the power may be made during sputtering which may be necessary for maintaining stoichiometric content.

The substrate upon which the film is deposited is continuously moved from one target to the next by a rotating arm. The plane of the rotating arms is parallel to the plane of the targets. Three arms make up the rotating unit for three substrates. Each substrate is approximately 4.0 cm below the target. The rotating unit is rotated by an outside motor via magnetic coupling. Typically, the rotating speed is set between 200 and 230 r.p.m., with 215 r.p.m. being the ideal speed. Each rotation typically deposits approximately 0.049 nm of Al, 0.007 nm of Fe, and 0.014 nm of Cu. Additionally, the substrates are near ambient temperature, only rising at most by a few degrees centigrade due to the energy influx in the deposition process.

In order to achieve this process cleanly and efficiently, a shutter covers the substrate samples to prevent material from being deposited onto them in the initial states of power adjustment and pressure adjustment of the pressure level of the argon gas. Additionally, the targets are cleaned by pre-sputtering during this time period. When the shutter is finally removed, via an outside control, the rotating arm with the substrates is then activated. Then the film is sputtered onto the substrates.

The sputter rate is monitored by three quartz thickness monitors, each one connected under each target. Minor adjustments in the deposition rate are controlled by the r.f. power source during the sputtering. Contamination of the vacuum chamber and of the argon gas is kept to a minimum by utilizing a liquid nitrogen trap and liquid-nitrogen-cooled shroud around the rotating unit inside the deposition chamber. The sputtering is continued until the desired thickness of the film is deposited onto the substrate. After one complete rotation, the substrate acquires the predetermined stoichiometric concentration of the elements, the number of rotations will determine the thickness of the film deposit. Then the power to each target is switched off, one by one, when the accumulated thickness as determined by a thickness monitor is sufficient.

It is expected that the deposition takes place at the atomic level with some mixing occurring on the sample substrate during the deposition. It is further expected that this occurs atom by atom. In fact, the quasicrystalline phase may be initiated during the deposition, essentially atom by atom. X-ray measurements taken on the as deposited films show that a fraction of the sample is already in the quasicrystalline phase. Typically, the electrical resistivity of the sample at this stage is approximately 100–400 $\mu\Omega$cm. The sample thickness depends on how long the above deposition process takes place. Typically, film thicknesses are in the range of 1 nm to 1,000 nm. Thinner samples can be achieved by careful control of the deposition rate, i.e., lowering the power to each target while maintaining the relative deposition rate at the required stoichiometry.

In order to create a high quality quasicrystalline thin film and to homogenize the quasicrystalline phase in the thin films, the samples need to be annealed in a vacuum chamber with external radiant heating. Annealing is typically performed at approximately 350° C. for two hours followed immediately by an additional two hours at approximately 450° C. The annealing is typically performed at these temperatures regardless of the film thickness. After annealing the samples are left to cool to an ambient temperature in the vacuum chamber. This process generally takes a few hours.

The presence of the quasicrystalline phase was confirmed by low angle X-ray diffraction and 4-point electrical resistivity measurements on the thin films, approximately 3,000–4,000 $\mu\Omega$cm.

This process for thin film depositions can occur on various substrates such as sapphire, quartz, glass, stainless steel and silicon. Typically, for the silicon substrates, approximately 1 nm of extra aluminum was added to help with the adhesion of the thin film to the substrate. Additionally, the annealing of the thin films on the silicon substrates always occurred at relatively low temperatures, such as below 570° C.

This process also demonstrated that excellent adhesion to the substrate was achieved by the diffusion of a small quantity of thin film constituents into the substrate as evidenced by time of flight secondary ion mass spectroscopy measurements (Tof-SIMS). This adhesion was observed on all of the aforementioned substrates. It is assumed that the high quality of the quasicrystalline thin films which persists up to the surface is due to the deposition method described herein, as the deposition occurs essentially in an atom by atom technique with a high degree of control of the constituents and stoichiometry. This deposition method produces thin films with little to no oxidation their surface. Additionally, this method of deposition is applicable to other quasicrystalline thin films known in the art.

While certain representative embodiments and details have been shown for purposes of illustrating the invention, it will be apparent to those skilled in the art that various changes of invention as disclosed herein may be made without departing from the scope of the invention, which is defined in the appended claims.

What is claimed is:

1. An article of manufacture, comprising:
   a quasicrystalline metal alloy film less than about 10,000 Å thick, said film having a composition of a general formula $Al_aCu_bFe_cX_dI_e$, where X represents one or more optional alloy elements and I represents manufacturing impurities, and where a=100−b−c−d−e; 24<b<26; 12<c<13; 0<d<10; and 0<e<3.

2. The article of manufacture of claim 1, wherein said optional alloy elements are selected from the group consisting of V, Mo, Ti, Zr, Nb, Cr, Mn, Ru, Rh, Ni, Mg, W, Si and the rare earth elements.

3. The article of manufacture of claim 1, wherein said film is formed by depositing in sequence on a substrate through radio frequency sputtering a stoichiometric amount of each respective alloy material and then annealing said each respective metal alloy, whereby to form said film through solid state diffusion.

4. The article of manufacture of claim 3, wherein said substrate includes a cutting edge.

5. The article of manufacture of claim 4, wherein cutting edge comprises a knife, scalpel, razor blade or electrosurgical blade.

6. The article of manufacture of claim 1, wherein the composition of said film is approximately: a=100−b−c−d−e; 24.4<b<26.0; 12.0<c<13.0; d=0; e=trivial.

7. The article of manufacture of claim 6, wherein said film is formed by depositing in sequence on a substrate through radio frequency sputtering a stoichiometric amount of each respective alloy material and then annealing said each respective metal alloy, whereby to form said film through solid state diffusion.

8. The article of manufacture of claim 7, wherein said substrate includes a cutting edge.

9. The article of manufacture of claim 8, wherein said cutting edge comprises a knife, scalpel, razor blade or electrosurgical blade.

10. The article of manufacture of claim 7, wherein said substrate is an electrical insulator, and said film is utilized as a component of an electronic device.

11. An article of manufacture comprising:
    a quasicrystalline AlCuFe alloy film less than about 10,000 Å thick, formed by depositing, in sequence on a substrate through radio frequency sputtering, respective layers containing stoichiometric amounts, respectively, of Al, Cu and Fe, and then annealing said respective layers to form said film through solid state diffusion.

12. The article of manufacture of claim 11, wherein said substrate includes a cutting edge.

13. The article of manufacture of claim 12, wherein said cutting edge comprises a knife, scalpel, razor blade or electrosurgical blade.

14. The article of manufacture of claim 11, wherein said substrate is an electrical insulator, and said film is utilized as a component of an electronic device.

15. The article of manufacture of claim 11, wherein said film is comprised of ternary stable AlCuFe quasicrystals prepared by the solid state diffusion of Al, Cu, and Fe layers.

16. The article of manufacture of claim 15, wherein said layers of Al, Fe and Cu are deposited in sequence in thickness ratios of 7.0/1.0/2.0, respectively, prior to annealing.

17. An article of manufacture, comprising:
    a quasicrystalline metal alloy film less than about 10.000 Å thick, said film:
    having a composition of the general formula $Al_aCu_bFe_cX_dI_e$, where X represents one or more optional alloy elements and I represents manufacturing impurities, and where $a=100-b-c-d-e$; $24<b<26$; $12<c<13$; $0<d<10$; and $0<e<3$ and being formed by depositing in sequence on a substrate through radio frequency sputtering a stoichiometric amount of each respective alloy material and then annealing said layers, whereby to form said film through solid state diffusion.

18. The article of manufacture of claim 17 wherein said film is comprised of ternary stable AlCuFe quasicrystals prepared by the solid state diffusion of Al, Cu, and Fe layers.

19. The article of manufacture of claim 18, wherein said layers of Al, Fe and Cu are deposited in sequence in thickness ratios of 7.0/1.0/2.0, respectively, prior to annealing.

20. The article of manufacture of claim 17, wherein said film is utilized for its thermal isolation properties.

21. The article of manufacture of claim 17, wherein said film is utilized to maintain a temperature gradient.

* * * * *

UNITED STATES PATENT AND TRADEMARK OFFICE
CERTIFICATE OF CORRECTION

PATENT NO. : 6,712,915 B2
APPLICATION NO. : 09/957893
DATED : March 30, 2004
INVENTOR(S) : Orest G. Symko et al.

It is certified that error appears in the above-identified patent and that said Letters Patent is hereby corrected as shown below:

On the title page:
In item (56) References Cited,
Other Publications,
2$^{ND}$ COLUMN, LINES 21-23,    Delete "Fauchais et al., Plasma Spraying: present and future, Pure & Appl. Chem., 1994., pp. 1247-1258, vol. 66, No. 6, Great Britain." [duplicate--previously listed at bottom of 1$^{st}$ column]

Signed and Sealed this

Seventeenth Day of April, 2007

JON W. DUDAS
*Director of the United States Patent and Trademark Office*